(12) United States Patent
Hinczewski

(10) Patent No.: US 6,974,656 B2
(45) Date of Patent: Dec. 13, 2005

(54) PASTE FILLED WITH METAL POWDER AND METAL PRODUCTS OBTAINED WITH SAME

(75) Inventor: Catherine Hinczewski, Stevenson Ranch, CA (US)

(73) Assignee: 3D Systems, Inc., Valencia, CA (US)

( * ) Notice: Subject to any disclaimer, the term of this patent is extended or adjusted under 35 U.S.C. 154(b) by 55 days.

(21) Appl. No.: 10/333,428

(22) PCT Filed: Jul. 19, 2001

(86) PCT No.: PCT/FR01/02349

§ 371 (c)(1),
(2), (4) Date: Jan. 7, 2003

(87) PCT Pub. No.: WO02/07918

PCT Pub. Date: Jan. 31, 2002

(65) Prior Publication Data

US 2003/0175621 A1 Sep. 18, 2003

(51) Int. Cl.$^7$ .............................. G03F 7/004; B22F 7/00
(52) U.S. Cl. ................. 430/270.1; 430/277.1; 430/285.1; 430/288.1; 430/198; 430/328; 430/330; 430/944; 430/945; 75/255; 419/5; 419/53
(58) Field of Search ........................ 430/270.1, 277.1, 430/285.1, 288.1, 198, 328, 330, 944, 945; 75/255; 419/5, 53

(56) References Cited

U.S. PATENT DOCUMENTS 5,496,682 A * 3/1996 Quadir et al. ............... 430/269
6,630,009 B2 * 10/2003 Moussa et al. ............... 75/255

FOREIGN PATENT DOCUMENTS

EP          470262 A1 * 2/1992 ............. B22F/1/00

* cited by examiner

*Primary Examiner*—Yvette C. Thornton
(74) *Attorney, Agent, or Firm*—Ralph D'Alessandro

(57) ABSTRACT

The present invention relates to a paste composition, including a bonding agent charged with a metallic powder, to be used in a prototyping procedure, a procedure for obtaining metallic products from said composition, and a metallic product obtained from said procedure. The composition is characterized by the fact that it includes:

a bonding agent comprised of at least one photopolymerizable resin, with a viscosity of less than 4000 mPa.s, measured at 25° C., a photoinitiator, in a concentration greater than 0.2% by mass with respect to the mass of the resin, and a metallic powder in a volumetric concentration greater than 40% with respect to the composition, with said composition having a minimum reactivity on the order of 5 mm$^3$/s per watt of lighting power.

26 Claims, No Drawings

PASTE FILLED WITH METAL POWDER AND METAL PRODUCTS OBTAINED WITH SAME

The present invention relates to a paste composition charged with metallic powder, a procedure for obtaining metallic products from said composition, and a metallic product obtained according to said procedure.

More specifically, the invention relates to a paste composition to be used in a rapid prototyping procedure, a rapid prototyping procedure for metallic products made from said composition, and a metallic product obtained according to said procedure.

The creation of three-dimensional parts with complex shapes in very competitive timeframes by rapid prototyping procedures which make use of stereolithography machines using a photosensitive liquid material which may be crosslinked or polymerized by illumination, by ultraviolet laser scanning for example, so-called powder sintering machines, employing a raw material in the form of a powder, whereby said powder may be locally bonded by a thermal effect, by infrared laser scanning for example, or machines using heating filaments or cutting out sheets, is known in prior art.

In addition to liquids, powders, filaments or sheets, there is another range of particularly interesting materials for rapid prototyping highly viscous materials which are not deformed by the action of gravity without necessarily being solids, hereinafter referred to as pastes. These pastes are obtained by blending a solid charge in the form of a powder, for example, a mineral, metallic or ceramic powder, into a bonding agent comprised of a photosensitive or heat-cured liquid resin, such as an acrylic, or epoxy photopolymerizable resin traditionally used in stereolithography. The term paste covers, in particular, materials with a very high viscosity, greater than 10,000 mPa.s or the so-called "marked threshold" materials. A "threshold" material does not flow (zero gradient) as long as the shear limitation applied to it does not exceed a minimum value. A "marked threshold" is considered to be reached when the value of this shear limitation is greater than 20 Newtons per square meter.

For the formation of three-dimensional parts using these pastes, a layering process is employed. The paste is spread in thin layers, with each layer being selectively solidified by a device emitting radiation, a laser, for example, combined with galvanometric mirrors, as in stereolithography or powder sintering. Such pastes may be used for the manufacturing of metallic products by performing an additional thermal treatment after the above-mentioned formation stage. This treatment, comparable to that of parts obtained by a metal injection molding (MIM) type process, consists on one hand in eliminating the organic portion of the formed part, that is the polymer part and the potential thermo-degradable additives, hereinafter referred to as "debinding," then in densifying the debinded part by sintering in order to obtain the desired mechanical properties.

However, current pastes do not allow for obtaining metallic products which present satisfactory properties. In fact, problems of cracking, swelling, bubbles or distortion appear during thermal treatment of parts formed from paste compositions and shrinkage phenomena during sintering have yet to be mastered.

In addition, it is known through U.S. Pat. No. 5,496,682 how to create sintered three-dimensional parts from a liquid composition presenting a viscosity preferably lower than 3000 mpa.s and not from a paste like the one described above, using a procedure similar to that described above, but adapted to an initially liquid composition. This patent relates essentially to the creation of parts sintered in ceramic as shown in the two examples presented. In order to maintain a good ability to flow, which is necessary for the described procedure, while maintaining a sufficient powder content, the initial liquid composition includes a photopolymerizable resin with a low viscosity on the order of 70 mPa.s for the resin used in example 1 and on the order of 5 mPa.s for the resin used in example 2, and must necessarily include a dispersant.

The object of the present invention is to propose a paste composition, which allows one through a prototyping procedure, to obtain metallic parts, which possess sufficient strength and low strain, with notable properties of the metal that was initially in the form of a powder.

Another object of the present invention is to propose a procedure for obtaining metallic products from the paste composition according to the invention.

Another object of the present invention is to propose a metallic product obtained according to the above-mentioned procedure.

An initial object of the invention is a paste composition, including a bonding agent charged with metallic powder, to be used in a prototyping procedure characterized by the fact that it includes:

a bonding agent comprised of at least one photopolymerizable resin, having a viscosity of less than 4000 mPa.s measured at 25° C., a photoinitiator, in a concentration of greater than 0.2% in mass with respect to the mass of the resin, and a metallic powder in a volumetric concentration of greater than 40% with respect to the composition, which will have a minimum reactivity on the order of 5 mm$^3$/s per watt of lighting power.

Appropriately, the resin does not present a benzene cycle.

According to one embodiment, the resin is a polyfunctional type acrylate resin with a functionality at least equal to three.

Appropriately, the resin is ditrimethylol propane tetraacrylate resin.

As a special feature, the metallic powder is present in a volumetric concentration greater than 50% with respect to the composition and includes at least 30% by volume of spherical particles.

As a special feature, the metallic powder is steel, stainless steel, titanium, titanium alloy, copper, tungsten, tungsten carbide, or nickel alloy powder or a blend thereof.

Appropriately, the powder presents a particle size of less than 45 μl.

As a special feature, the composition includes at least the following additives:

a rheological control agent dissolved in the resin in a concentration of between 2 and 15% by weight with respect to the weight of the resin, a reactive or non-reactive diluent with a viscosity of less than 100 mPa.s, in a concentration from 2 to 20% by weight with respect to the weight of the resin, an agent, dissolved or not in the resin, which allows for the increased reactivity of the composition with respect to illumination, a coupling agent in concentrations from 0.1 to 0.3% by weight with respect to the metallic powder, a wetting and/or dispersant agent, in a concentration lower than 1% by weight with respect to the metallic powder, a lubricating agent in a concentration lower than 0.5% by weight with respect to the metallic powder, a carbon collector, an adhesive agent, additives in the form of a metallic powder with a melting point lower than that of the metallic powder.

In another embodiment, the particles forming the metallic powder are covered with a coating, which has the particularity of being at least two times less absorbent than the metallic powder.

Appropriately, the coating layer is comprised of a wax or a layer of oxidation formed by the oxidation of the particles forming the powder, improving the composition's reactivity.

Appropriately, the metallic powder is comprised of a homogenous blend of metallic powders, of the same type or not, with at least two different particle sizes, having a particle size ratio between 1/10 and 1/5, preferably on the order of 1/7.

Preferably, the photoinitiator is an α-amino-ketone. Appropriately the photoinitiator is 2-benzyl-2-dimethylamino-1-(4-morpholinophenyl)-butanone-1.

In another embodiment, the composition includes an activation agent such as isopropyl thioxanthone, 1-chloro-4-propoxythioxanthone, or 4-benzoyl-4'-methyldiphenyl sulfide, or a blend of at least two of these, in combination with a co-initiator such as ethyl p-dimethylaminobenzoate.

Another object of the invention is a procedure to obtain metallic products from the paste composition as defined above, characterized by the fact that it includes:

a) a formation stage of a composite three-dimensional product comprised of superimposed thin layers of paste, obtained by the repetition of a cycle including the following stages:

transformation of the layer which has just been placed by photopolymerization of the bonding agent, coating of the transformed layer with a new non-transformed layer.

b) an elimination stage of the polymer contained in the composite product obtained in the preceding stage a) by means of a thermal treatment, called the debinding stage, and c) a sintering stage of the debinded metallic product obtained in the preceding stage b).

As a special feature in the formation stage, the layers of paste placed have a thickness of less than 50 μm.

Appropriately the debinding stage is performed by a liquefied neutral or reduction gas system or under vacuum and may or may not be followed by an additional dosage treatment of carbon residue in the presence of oxygen, carbon monoxide or carbon dioxide to better control the final composition and structure of the sintered metal.

As a special feature, the thermal cycle of the debinding stage includes rapid heating stages in temperature zones in which the bonding agent degrades little or not at all and slow heating stages and stops in zones in which the bonding agent degrades quickly, comprising a complete cycle lasting less than 48 hours. As another special feature, the sintering stage induces the consolidation of the product by densification of the porous debinded product at a temperature lower than the metal's melting point, for example at 3/4 of the metallic powder's melting point.

Appropriately, the sintering stage is performed by a liquefied gas system (neutral or reduction) or under vacuum, under conditions such that the temperature range is at most +/−10° C.

Appropriately, during the sintering stage, the thermal cycle includes rapid heating stages, greater than or equal to 5° C./min, in temperature zones in which the debinded product does not undergo transformation and slow heating stages, less than or equal to 1° C./min, or stabilization steps lasting less than one hour in the zones in which the debinded product undergoes physical transformation, and the sintering step lasting between 30 minutes and 5 hours, preferably 1 hour.

Another object of the invention is a debinded sintered metallic product obtained by the procedure according to the invention as defined above.

As a special feature, the metallic product presents less than 2%, preferably less than 0.5%, by mass of carbon residue with respect to the mass of the initial composition resin.

As another special feature, the metallic product presents temporary support elements, created in such a way that, in a radius of 1.5 mm, there are at least two distinct points pertaining to two distinct support elements solidified on a single layer in order to provide support for the product's overhanging parts.

The paste composition according to the invention includes a photopolymerizable or photosensitive resin, in combination with a photoinitiator, charged with a metallic powder. The photopolymerizable resin used in this invention preferably presents a viscosity of less than 4000 mPa.s (at 25° C.) and the composition prepared from this resin and the metallic powder has a reactivity of at least 5 mm$^3$/s/W with respect to illumination, for example, an ultraviolet type illumination. The composition's reactivity is clearly a function of the type of resin, but also of that of the photoinitiator and the metallic powder used. In the case of a resin, which is photopolymerizable by ultraviolet light, the composition's reactivity will vary on the order of 5 mm$^3$/s/W$_{UV}$ up to 40 mm$^3$/s/W$_{UV}$ in the optimum wavelength field for the composition.

Different acrylate type, photopolymerizable resins activated by ultraviolet radiation may be used in this invention, in particular a tetra-functional acrylate resin such as ditrimethylol propane tetraacrylate resin, marketed by the company "Cray Valley" under the trade name "Sartomer "SR 355" hereinafter referred to as "SR355." It is essential to reach high powder rates in the resin (at least 50% by volume but preferably up to 70% if possible) for improved control of the geometry of the sintered parts and accelerated sintering. The low viscosity of this "SR 355" resin, on the order of 700 mPa.s, allows for high powder charge rates to be reached and the increased efficiency of the various additives described below, in particular that of a rheological control agent. The tetra-functional nature of this "SR 355" resin makes it highly reactive to ultraviolet radiation, with an appropriate initiator, even when it is highly charged with metallic powder.

A dipentaerythritol pentaacrylate resin, marketed by the is company "Cray Valley" under the trade name "Sartomer SR 399" may also be used in the paste composition according to the invention. This resin presents high reactivity, but its high viscosity (10 times more viscous than the above-mentioned resin "SR 355") prevents its use in the event that the metallic powder charge exceeds a certain percentage.

In order to reduce the viscosity of the resin, it is possible to add a specific quantity of a more fluid resin known as a diluent. This diluent, preferably reactive (that is, it will create a cross-linked network under the influence of the light like the resin), has a viscosity of lower than 100 mPa.s and is incorporated in concentrations of between 2 and 20% by mass with respect to the resin. It allows for the increase of the volumetric rate of powder (by a few percentage points) and improves the efficiency of a rheological control agent, which provides the paste with a Bingham fluid type performance (a very high flow threshold). In the case of a highly reactive "SR 355" resin, this may be diluted with 2 to 20% of more fluid resins, such as those marketed by the company "Cray Valley" under the trade name "SR 256" (2-(2-ethoxyethoxy) ethyl acrylate) which has a viscosity of 5 mPa.s or "SR 9003" (neopentyl glycol dipropoxyle diacrylate) which has a viscosity of 17 mPa.s, to provide a resin which remains highly reactive with a viscosity on the order of 400 mPa.s. Other resins more fluid than the resin, such as those marketed under the trade names "SR 531" (cyclical formal trimethylolpropane acrylate), "SR 454" (trimethylolpropane triethoxylate triacrylate), or "SR 494" (pentaerythritol tetraethoxylate tetraacrylate) may also be used. The composition according to the invention may include a blend of resins containing at least 50% "SR355" resin and at most 50% of more fluid resins used as diluents, in which 2 to 20% are reactive resins such as those mentioned above, with the remainder comprising non-reactive resin(s).

Appropriately, the resin used in the compositions does not present a benzene cycle. This lack of a benzene cycle has many beneficial effects. It facilitates the elimination of the polymer during debinding. In fact, it seems that this lack of a cycle favors the breakdown into gaseous substances of a small size (while, on the contrary, the benzene cycle is not is "broken" during the treatment and creates constraints during its diffusion through the product). In addition, a resin lacking a benzene cycle according to the invention allows for a low rate of carbon residue, below 2%, preferably below 0.5% by mass with respect to the mass of resin after thermal breakdown during the debinding stage. In this case using the "SR355" resin, a carbon residue on the order of 0.4% is obtained. For the sake of comparison, pastes with compositions similar to those of the invention but including a diphenol type resin have much higher carbon residue, for example with a resin marketed by the company Akzo under the trade name Diacryl (diphenol A ethoxylate dimethacrylate) and "SR 349" (diphenol A ethoxylate diacrylate), the pastes have carbon residues of 1.1% and 4.2%, respectively. The low carbon residue of the "SR355" decreases the risk of heterogeneity of composition in the finished metallic product, in particular due to the formation of carbides. This property, which seems to be due primarily to the absence of an aromatic cycle makes an important contribution to the control of deformations and a better control of shrinkage during sintering. Shrinkage indicates the reduction of the volume of the parts, which accompanies their densification during sintering. In fact, trials have shown that the shrinkage, during sintering, of a part made from the paste composition according to the invention, is practically isotropic (identical linear shrinkage in all three spatial directions) while this was not the case with resins which have a benzene cycle. It is also useful to limit the percentage of residual carbon to obtain good mechanical properties in the finished parts. For example, in the case of steel powder, a lower quantity of residual carbon, better distributed in the structure of the metal, runs a lower risk of diminishing the strength of the sintered parts since the carbon tends to form carbides (of chrome, molybdenum, etc.) which, positioning themselves around the grains of steel, weaken the structure of the metal. Of course, the higher the percentage of carbon residue, the greater the risk of disrupting the initial composition of the steel.

Trials have shown that the problem of cracking or swelling often encountered during thermal treatment of pastes using other resins is definitively resolved with the use of a resin such as the one defined above. In addition, in order to avoid the above-mentioned problems, the heating speeds, which should be limited to 0.05° C./min during debinding in the degradation zone of the polymer with the above-mentioned paste compositions, may be increased at least up to 0.1° C./min, or even to 0.2° C./min for an equivalent quality. Said trails have been performed on parts with walls of up to 8 millimeters thick, and have not shown the slightest typical debinding problem. The charge does not seem to play a significant role during the debinding-since trials with other charges have yielded similar results. These observations clearly only remain valid if the quantity of polymer to be eliminated during debinding is not too high with respect to the quantity of the remaining charge, so the debinded part has a sufficient content.

The composition includes an initiation system including a photoinitiator. In the case of resins sensitive to ultraviolet light, such as the above-mentioned polyacrylate resins, the photoinitiator may be comprised of one of the photoinitiators which absorb the wavelengths of the Argon laser (351–364 nm) marketed by the company Ciba-Geigy under the trade names "Irgacure 369" (2-benzyl-2-dimethylamino-1-(4-morpholinophenyl)-butanone-1), "Irgacure 651" (2,2'-dimethoxy-2-phenylacetophenone), "Irgacure 1700", "Irgacure 819" or "Darocur 1173." Preferably, the photoinitator belongs to the α-amino-ketone family, since the composition's highest reactivity is obtained with the initiator marketed under the trade name "Irgacure 369."

It is also possible to use a resin and a photoinitiator (such as the one marketed under the trade name "Irgacure 784DC" or "Irgacure 1700"), which allows for work with visible light, using a machine equipped with a device emitting rays of light in the visible spectrum.

The initiation system may also include an activation agent, which allows for the movement of the activation wavelength of the photoinitiator, which, once activated, will react with the resin. As an example, in the case of an ultraviolet photoinitiator, such as Irgacure 369, the activation agent may be chosen from among isopropyl thioxanthone, 1-chloro-4-propoxythioxanthone, or 4-benzoyl-4'-methyldiphenyl sulfide, in combination with a co-initiator such as ethyl p-dimethylaminobenzoate.

The volumetric concentration of the composition according to the invention in metallic powder is preferably greater than 50%. Such a volumetric concentration is possible with the use of a resin as defined above, potentially with additives such as those described below. This high percentage permits a sufficient dimensional control after sintering. The metallic powder preferably includes at least 30% by volume of spherical particles to allow for the increase of the maximum volumetric concentration of powder in the composition and to favor the densification during sintering. The maximum volumetric concentration is the powder concentration for which the composition's viscosity becomes infinite. In practice, we speak of maximum volumetric concentration in powder, the concentration beyond which it becomes difficult to create homogenous blends by traditional means (blenders) considering the influence of the additive on the formulation.

Preferably, the powder presents a particle size (average particle diameter) of under 45 $\mu$m, not only due to the thicknesses of the layers used in a prototyping procedure, but also due to its better sintering performance. It is also possible to use powders with smaller particle sizes, for example, a particle size of less than 10 $\mu$m, similar to that used in MIM procedures, in order to limit the problems of deformation encountered during sintering. In addition, the use of a very-fine powder allows for a better homogenization of the composition and better control of densification.

A homogenous blend of powders, of the same type or otherwise, with adapted particle size and in adequate concentrations may be used in order to significantly increase the maximum volumetric concentration in powder and improve densification control. Such an increase may be-obtained since the finest particles may be positioned in the voids left by the largest particles, that is, since the ratios of particle diameters is on the order of ⅟₇. For example, in the case of steel particles, the use of a carbonyl iron powder, with a finer particle size than that typical of steel, improves the densification thanks to the presence of fine particles and limits the deformations thanks to a higher concentration of steel. In addition, the strength of the metallic product may also be improved thereby.

Different powders have been tested in combination with a single resin, for example resin type "SR 355."

| Reference | Particle Nature | Particle Type | Particle Size (in μm) | Reactivity (in mm³/s/$W_{UV}$) |
|---|---|---|---|---|
| 316L | stainless steel | spherical | <22 | ~5 |
| 316HIC | | spherical | <44 | ~35–40 |
| 316LF | | non-spherical | <44 | — |
| — | titanium | non-spherical | <44 | — |
| TA6V | titanium alloy | spherical | <44 | ~35–40 |
| TA6V | | non-spherical | <44 | — |
| — | nickel alloy | spherical | <44 | — |
| — | copper | spherical | <44 | ~35–40 |

Composition of referenced powders in % by mass:
316L: chrome (16.5 to 20%); nickel (8 to 14%); molybdenum (2.5 to 3.5%); carbon <300 ppm; iron (~62.5 to 73%)
316 HlC: chrome (16.5 to 20%); nickel (8 to 14%); molybdenum (2.5 to 35%); carbon 0.14%; iron (~62.5 to 73%)
TA6V: aluminum (6%); vanadium (4%); titanium (90%)

The importance of spherical particles has been verified on very different materials. In all cases, the use of a spherical particle powder has led to better results. In the case of stainless steel, for the same metal and a different particle size, trials have shown that, for similar rheological performance, the maximum volumetric concentration goes from 44% for 100% non-spherical particle powder to 63% for 100% spherical particle powder.

The theoretical maximum volumetric concentration which may be obtained with a stack of perfect spheres is 74% by volume. For stainless steel with a density of 8, this maximum concentration corresponds to a quantity by mass on the order of 95% (this concentration depends on the density of the resin). As an example, the composition includes 91% by weight, or 58% by volume of stainless steel powder; this concentration may be increased up to the maximum volumetric concentration, which is on the order of 63%. For titanium with a density of 4.5, the maximum volumetric concentration represents a quantity by mass on the order of 92%. As an example, the composition includes 83% by weight, or 55% by volume, of titanium powder; this concentration may be increased up to the maximum volumetric concentration, which is on the order of 60%.

One of the conditions which must be met to use the composition in a rapid prototyping procedure such as the one described in the present invention, is the reactivity of the composition, since it is subjected to ultraviolet radiation. The introduction of charges such as metallic powders strongly diminishes the penetration of light into the composition since part of this radiation is absorbed by the powder and is no longer available for the photopolymerization reaction. This causes two major problems: on one hand, the depth of the polymerization is so low that it is impossible to maintain a layer thickness on the order of 100 μm which is traditional in liquid stereolithography: on the other hand, the scanning speeds are much slower than those used to polymerize liquid resins. As an example, with an ionized argon laser (351 and 364 nm UV rays), the volumetric reactivity goes from approximately 600 mm³/s/W for an uncharged liquid resin to approximately 5 mm³/s/W for a composition based on the same resin and including approximately 58% by volume of spherical steel particles (<22 μm).

In order to improve the paste's reactivity, the particles may be coated with a specific compound, which modifies the optical properties of the powder and the performance of the paste in the presence of ultraviolet radiation. This compound, comprised of a coat of a specific thickness, must serve as a screen to avoid the absorption of the light by the particle. To do this, it must be less absorbent than the metallic particle which serves as its support (at least two times less: it may not be absorbent at all); it may also have a refractive index such that the impinging light is reflected and/or diffused in the dispersant medium (the resin). The role of this compound is to allow for the "recovery" of the radiation normally absorbed by the powder and make it available for the resin (actually the initiator) and the polymerization reaction. This contributes to the significant improvement of the composition's reactivity. This compound may be a wax, for example, with the additional advantage that it completely degrades without residue. This wax could be polyethylene or polyamide.

The coating may also be a layer of oxides formed on the surface of the metallic particles. This layer of oxides must be sufficiently thick to modify the performance of the powder with respect to the ultraviolet radiation. Of course, the level of the oxidation must be perfectly controlled since an overly oxidized powder will not sinter well. In addition, this layer of oxidation may contribute to a more efficient elimination of the carbon during debinding.

The composition may also include a compound which increases its reactivity with respect to the illumination. This compound may be added to the resin (dissolved in the resin or not) and/or, as described above, it may be a coating compound for the particles forming the metallic powder. This additive is, for example, a polyethylene wax.

Of course the nature of the powder is not limited to the above examples, and may be made, for example, of carbon steel, tungsten, tungsten carbide, tungsten-cobalt carbide alloy, nickel alloy, chrome alloy, or copper alloy particles, etc.

The fact of adding charges, specifically metallic charges, in a liquid medium often causes problems of powder particle sedimentation. In the case of steel (density on the order of 8), this is translated into a very rapid decantation of the particles and prevents the use of a blend in a procedure such as the one described in the invention. In fact a powder sedimentation during storage of the paste or during formation leads to a heterogeneity of the composition, primarily in the vertical direction, which over the course of thermal treatment, is translated into differential shrinkage causing distortions or deformations. The composition according to the invention may include different additives, which strongly limit sedimentation. Such an additive must modify the rheology of the blend in such a way that the paste obtained presents a very high flow threshold and a low viscosity at significant shear rates (Bingham type fluid performance or threshold shear thinning). Thus, the sedimentation is limited when the paste is at rest since its viscosity diminishes during manufacturing to facilitate the spreading of the layers. A rheological control agent may be added to the resin, for example by dissolution under agitation and heating in the resin. This rheological control agent may be chosen from among polyamide wax-based compounds or hydrogenated castor or urea oil. This is, for example a polyamide wax, such as the one marketed by the company "Kusomoto Chemicals" under the trade name "Disparlon 6650" or the one marketed by the company Cray Valley under the trade name "Cray Vallac Super." Concentrations from 2 to 15% by mass with respect to the mass of the resin results in a fluid paste or gel to which the metallic powder is added. The paste obtained presents a high flow threshold and a low viscosity at high shear rates. The addition of this Theological control agent prevents sedimentation of the powder during storage or formation which would lead to heterogeneity of the composition, primarily in the vertical direction, is which during sintering would translate into differential shrinkage causing distortions or deformations. In addition, such an additive allows consideration of paste compositions including metal powders which are denser than steel with a density of 8, or copper with a density of 9, such as tungsten with a density of 19, or tungsten carbide with a density of 16.

If the compatibility between the powder and the liquid medium (resin) is poor (due to the very different natures of these compounds) and/or if the wetting of the liquid on the particles is poor (surface state of the particles, surface tension of the liquid too high with respect to that of the surface of the particles), there will be poor adhesion of the resin to the particles, which results in a heterogeneous blend and the poor mechanical strength of the composite parts manufactured from the composition. An additive improving the cohesion of the blend is added to the formulation which improves the homogeneity of the blend, increases the strength of the composite parts and increases the maximum volumetric concentration in powder for a similar performance during manufacturing (decrease of volume of air trapped in the system). It is preferable that this not modify or have very little effect on the reactivity of the composition. Thus, it allows for better control of shrinkage and deformations during thermal treatment.

This additive may be a so-called coupling agent compatible with the resin in order to avoid the formation of lumps, for example a silane type coupling agent such as the one marketed by the company "Witco" under the trade name "Silquest A-1120," in concentrations from 0.1 to 0.3% by mass with respect to the mass of the metallic powder.

This additive may also be a wetting and/or dispersant agent which modifies the surface tension of the liquid surface and/or creates a screen (electrostatic or steric) around the particles in order to keep them separated from each other and avoid bonding problems which lead, in turn to sedimentation of the particles and the decrease of the maximum volumetric concentration. Such additives form strong interactions (such as chemical absorption) between the liquid and the powder. For example, this could be a wetting and dispersant agent, present in a concentration of under 1%, preferably below 0.5% by weight with respect to the weight of the metallic powder, such as those marketed by the company "Lucas Meyer" under the trade names Forbest H60 and Forbest 610 or that marketed by the company "Byk Chemie" under the trade name Disperbyk 111.

This additive may also be a lubricant, as is commonly used in the metal injection molding (MIM) process, such as stearic acid or the metallic derivatives of stearic acid. Such a lubricant, which has an action similar to that of a wetting/dispersant agent without, however, creating such strong interactions, permits the increase of the maximum volumetric concentration in powder of the composition. However, it must be noted that it significantly reduces the reactivity of the paste. It must be added in a low concentration: less than 0.5% with respect to the mass of the metallic powder.

This additive may also be an adhesive agent, such as a resin possessing a known adhesive power on metallic substrates. It may be added to the resin forming the bonding agent in order to improve the wetting between the bonding agent and the metallic powder. As an example, this adhesive agent could be one of the resins marketed under the trade names "SR 705" (polyester acrylate), "SR 9050" (acid monoacrylate), "SR 9051" (acid triacrylate) or a blend thereof.

Additives in the form of a metallic powder with melting points below the sintering temperature of the metallic powder, may be added in order to induce a liquid phase sintering. They contribute to the homogenization of the composition during sintering and lead to a greater densification and more controlled shrinkage. The sintering temperature and/or the duration of the stage are also reduced since the liquid phase sintering process is faster. Some of these additives may partially compensate for the shrinkage caused by the densification (we speak of "swelling" due to the liquid phase) and lead to lower shrinkage than in the absence of the additive. As an example, in the case of a steel particle powder, this metallic additive may be comprised of a copper, aluminum or boron powder. Adapted concentrations of this additive result in a sintering with a minimum of shrinkage and/or improved properties and/or improved dimensional control. In the case of steel, this concentration may range from 0.2% by mass with respect to the mass of the steel for the boron, up to 30% for the copper or its derivatives such as bronze. Given its homogenization role, the liquid phase sintering may contribute to the formation of new alloys with new physical properties, which may be adjusted as a function of the desired application.

The formation of the three-dimensional composite product from the paste according to the invention, may be performed by a prototyping machine ("Optoform" type), such as the one described in French patent application No. 99 02719, filed by the applicant. The formation of the three-dimensional product is obtained by the placement by means of a recoater blade and the polymerization by means of illumination of superimposed thin layers. Due to a reactivity lower than that of the resins traditionally used in stereolithography, with which the thickness of the polymerized layer allows for work with layers of a thickness equal to 100 $\mu$m (or even thicker), the formation of a composite product from a paste composition according to the invention is performed with a layer thickness of less than 50 $\mu$m, varying for example from 25 to 50 $\mu$m depending on the metallic powder used. The speed of movement of the light may be similar to that used in stereolithography and thus reach several meters per second, since the fact that the layer is thinner does not prevent working at high speeds. Thus, with an "Optoform" type machine, manufacturing times comparable to those of other rapid prototyping techniques can be achieved.

Considering the high viscosity of the metallic paste, the average strength of the composite parts after polymerization and the low thickness of the layers used, it is necessary to generate specific supports when the layer just placed must present parts to be hardened which extend beyond the hardened portions of the lower layer. These specific supports are comprised of points, segments, lines, solidified surfaces (called support elements), distributed in the field formed by the layer placed in such a way that their density is such that, in a radius of less than 1.5 mm, there are at least two points pertaining to two distinct, solidified support elements. In comparison, in the case of uncharged liquid formulations, this density is generally greater than 2.5 mm, and often 10 mm.

The debinding treatment of the three-dimensional composite part may be performed by a liquefied neutral or reduction gas system to avoid oxidation. It is preferable to perform the debinding under vacuum (since the pressure is lower than the vapor pressure of the organic compounds, the breakdown takes place by diffusion and evaporation of small gaseous molecules rather than by "cracking"; this limits the constraints causing cracks and swelling). In this case, it is necessary to use a special airtight assembly that can withstand temperatures on the order of 600° C., including condenser systems, dust and vapor traps in order to minimize the fouling of the treatment kiln and vacuum pump. This assembly has proven very effective for most resin systems, in particular in the case of an "SR 355" type resin for which a liquefied gas or even air debinding (for charges that do not oxidize in air, such as ceramic charges for example) may be considered. The thermal cycle of the debinding may be optimized, depending on the decomposition atmosphere, by thermo-gravimetric analyses. The polymer degradation may spread over a temperature range going, for example from 200 to 500° C., with one or more zones of degradation as a function of the nature of the degraded products. In the degradation zones, the temperature increase must be slow and progressive to avoid the accumulation of constraints and suppression on the parts which would lead to the formation of cracks, swelling, bubbles, distortion, etc. The speed of the temperature increase also depends on the thickness of the walls of the parts. Outside these degradation zones or in temperature areas where the loss of mass varies little (derived in relation to low or no temperature change), the heating may be accelerated. The complete debinding cycle may be optimized so that the shortest treatment results in debinded parts presenting no defects. As an example, the cycle lasts between 36 and 48 hours.

With the goal of completely eliminating the residual carbon, a debinding stage may be planned to take place with a liquefied reduction gas system (hydrogen) in order to accelerate the degradation of the carbonaceous compounds or an additional dosage treatment of the carbon residues in the presence of.

oxygen; in this case, the quantity of oxygen introduced must be controlled with great precision in order to avoid the oxidation of the metal carbon monoxide or carbon dioxide this dosage must also be carefully controlled since it also risks oxidizing the metal.

In order to consolidate the debinded part, it is subjected to a sintering cycle during which the part undergoes a temperature increase at a determined speed up to a temperature known as the sintering temperature, at which it remains for a specific time (the sintering stage). The sintering allows for the densification of the parts by suppressing the porosity left by the polymer once it has been degraded. This densification is accompanied by a modification of the part's dimensions, known as shrinkage, which is controlled by the sintering temperature and the duration of the stage. This sintering temperature depends on the nature and particle size of the powder and the desired final properties. In the event that deformations appear during the densification, it may be useful to perform intermediate stages used to stabilize the system at critical temperatures where specific physical phenomena occur (end of debinding, change of phase, disappearance of pores, etc.). Between two stages, the speed of the temperature increases or heating ranges may be different and may be very slow if the physical phenomena resulting from the heating are too fast and poorly controlled. These specific zones may be determined by dilatometry experiments. In general, the sintering cycle includes at least one stage in addition to the sintering stage. As a function of the composition of the powder used, a sintering cycle may be adapted (with several heating speeds and stabilization stages) in order to allow for an optimum dissolution of the carbon and a minimal formation of carbides, which limit the constraints due to the densification and/or cooling to their maximum levels. Mechanical strength is directly related to the density of the finished part. The sintering temperature and the duration of the stage may be adapted as a function of the strength and/or shrinkage limitations during sintering. Different speeds for temperature increases have been tested (1-2-5-10-20° C./min) without showing notable consequences on the final properties of the product. Likewise, the tested durations of the sintering stage (1 h-3 h-5 h) do not seem to modify the final properties of the metallic object. Typically, the speed of heating is 5° C./min and the duration of the stage is 1 hour. This heating speed is relatively slow for sintering but allows for good homogenization of the support and the whole part.

It is clear that the higher the density, the greater the strength, but dimensional control is difficult. In fact, starting with a paste initially charged with 55% by volume of metallic powder, linear shrinkage can reach close to 20%. These observations demonstrate the interest in maximizing the resin charge in metallic powder from the start.

The sintering temperature is always lower than the melting point of the material and may, for example, correspond to approximately ¾ of the melting point of the material used. For example, with stainless steel (spherical particles <22 and <44 $\mu$m), the sintering stage may be performed at a temperature between 1,150 and 1,280° C. In most trials, with stainless steel <44 $\mu$m and for compositions containing from 55 to 58% by volume of metallic powders, the temperature was between 1,200° C., with an observed linear shrinkage of between 5 and 8%, and 1250° C. with an observed linear shrinkage of 18%.

To avoid the oxidation of the metal, the sintering is performed in a neutral atmosphere, for example in argon or nitrogen, either in a reducing atmosphere, ideally in dry hydrogen or a hydrogen/nitrogen blend, or under vacuum. For stainless steel, the sintering stage may take place in argon, a 90/10 hydrogen/nitrogen blend or under a primary vacuum. In this specific latter case, a partial pressure of argon or nitrogen avoids the vaporization of elements such as chrome, at high temperatures. Nitrogen may create a nitride layer on the surface of the parts, which when poorly controlled, may lead to a heterogeneous microstructure. For titanium and its alloys, which are very sensitive to oxygen and carbon, the treatment is preferably performed under a secondary vacuum.

Deformation problems (vertical and horizontal distortions) during sintering may be attributed to heterogeneity of temperature (which may be due to the introduction of a cold liquefied gas) and of composition due to a non-uniform distribution of carbon residues. The oxidation of particles, during debinding, for example, may also cause differential shrinkage, which translates into constraints and deformations. Problems attributable to the kiln can be ruled our when working with an airtight kiln with a homogeneity of temperature lower than +/−10° C., preferably lower than +/−5° C.

With respect to stainless steel powders containing very little carbon, such as product reference 316L in which <0.03% of the quantity of carbon or residue (in the form of a hydrocarbon), resulting from the debinding, although limited to 0.4% by mass with respect to the mass of the resin of a paste according to the invention, is predominant with respect to that contained in the initial composition of the steel particles forming the powder. This residual carbon is thus all the more difficult to solution heat treat and the excess has a tendency to form carbides, preferably chrome and molybdenum carbides which are distributed around the grains of steel, thus modifying the composition from a microscopic point of view and weakening the steel. The more carbides are formed, the more difficult it is to control the homogeneity of the composition and the more the parts (especially those with variable geometries) risk being deformed. In order to stabilize the steel by avoiding the formation of chrome and molybdenum carbides (coming from the steel), in addition to appropriate sintering conditions, as described above, a paste composition including an additive forming a carbon collector may be provided, such as titanium, niobium, tungsten, vanadium, molybdenum or tantalum, associated or not with a prior thermal treatment, following the debinding stage, residual carbon dosage by carbon monoxide or carbon dioxide or oxygen, as indicated above.

In a steel with a higher carbon content, by several tenths of a percent, the final composition and microstructure of the steel are less sensitive to the contribution of carbon residues in low quantities, such as those on the order of 0.4% with respect to the mass of the resin contained in the composition coming from the use of the paste composition according to the invention.

For the case of titanium and its alloys, which are very hungry for carbon and oxygen, the carbon itself in significant quantities is solution heat treated and limits the problems of heterogeneity. On the other hand the low quantity of oxygen, which may come from the degradation of the polymer is sufficient to weaken the material.

The following examples, meant for illustrative purpose and imposing no limitations, allow for a better understanding of the invention.

Examples of Paste Compositions

Unless indicated otherwise, the percentages are expressed by mass with respect to the mass of the resin Composition A resin: "Sartomer SR 355" (ditrimethylolpropane tetraacrylate),
photoinitiator: "Irgacure 369" (2-benzyl-2-dimethylamino-1-(4-morpholinophenyl)-butanone-1), 1%,
diluent: "Sartomer SR256" resin (2-(2-ethoxyethoxy) ethyl acrylate), 5%
rheological control agent: "Disparlon D 6650," 10%,
metallic powder: stainless steel 316HIC (<44 μm, melting point: 1370-1400° C.), 58% by volume/total volume.

Composition B resin: "Sartomer SR 355" (ditrimethylolpropane tetraacrylate),
photoinitiator: "Irgacure 369" (2-benzyl-2-dimethylamino-1-(4-morpholinophenyl)-butanone-1) 1%,
diluent: "Sartomer SR9003" resin (neopentyl glycol di-propoxylate diacrylate), 10%.
rheological control agent: "Cray Vallac Super," 10%,
metallic powder: TA6V (<44 μm, melting point 1600–1650° C.), 57.5% by volume of total volume.

Actual Duration of Stages

The following cycle, with a total duration of approximately 40 hours, was performed on a debinding assembly for both compositions A and B, under a primary vacuum (between $10^{-2}$ and 10 mbar).

| Temperature range in ° C. | Heating speed in ° C./min | Stage duration in minutes |
| --- | --- | --- |
| 20–160 | 1 | 180 |
| 160–270 | 1 | — |
| 270–360 | 0.1 | — |
| 360–420 | 0.1 | 180 |
| 420–520 | 0.2 | 360 |

It must be noted that the above cycle considers an inertia of approximately 50° C. between the reference temperature taken in the kiln enclosure and the actual temperature in the debinding enclosure. Thus the stage temperatures may vary according to the debinding assembly used. The heating speed depends on the thickness of the walls of the parts. The cycle described above is appropriate for maximum thicknesses of 4-5 millimeters. Beyond this, it is necessary to lower the heating speed in the critical zone by 270° C.–520° C.

Sintering Cycle for Composition A

The sintering stage was performed in argon.

| Temperature range in ° C. | Heating speed in ° C./min | Stage duration in minutes |
| --- | --- | --- |
| 20–500 | 5 | 30 |
| 500–650 | 5 | 30 |
| 650–850 | 5 | 30 |
| 850–1200 | 5 | 60 |
| 1200–400 | 5 | — |
| 400–20 | Natural cooling | |

Sintering Cycle for Composition B

The sintering stage was performed under a secondary vacuum ($10^{-6}$–$10^{-4}$ mbar)

| Temperature range in ° C. | Heating speed in ° C./min | Stage duration in minutes |
| --- | --- | --- |
| 20–1250 | 5 | 60 |
| 1250–400 | 5 | — |
| 400–20 | Natural cooling | |

Although the invention has been described in relation to specific examples, it is clear that it is in no way limited thereto and that it includes all technical equivalents of the means described as well as the combination thereof if they fall within the framework of the invention.

What is claimed is:

1. A paste composition, including a bonding agent charged with metallic powder, to be used in a prototyping procedure, comprising in combination:
    a. a bonding agent including at least one photopolymerizable resin with a viscosity of less than 4000 mPa.s measured at 25° C.;
    b. a photoinitiator, in a concentration greater than about 0.2% by means with respect to the mass of the resin; and
    c. a metallic powder in a volumetric concentration greater than about 40% with respect to the composition with said composition having a minimum reactivity of about 5 mm$^{3}$/s per watt of lighting power.

2. The composition according to claim 1 wherein the resin does not include a benzene cycle.

3. The composition according to claim 1 wherein the resin is a poly-functional acrylate type resin with a functionality at least equal to three.

4. The composition according to claim 3 wherein the resin is ditrimethylol propane tetraacrylate resin.

5. The composition according to claim 4 wherein the metallic powder is present in a volumetric concentration greater than about 50% with respect to the composition and includes at least about 30% by volume of spherical particles with respect to the powder.

6. The composition according to claim 5 wherein the metallic powder is selected from the group consisting of a steel, stainless steel, titanium, titanium alloy, copper, tungsten, tungsten carbide, nickel alloy and combinations thereof.

7. The composition according to claim 6 wherein the powder has a particle size of less than about 45 μm.

8. The composition according to claim 7 further comprising at least one additive, the additive being selected from the group consisting of:
    a rheological control agent dissolved in the resin in a concentration of about 2 to about 15% by weight with respect to the weight of the resin,
    a reactive or non-reactive diluent with a viscosity less than about 100 mPa.s in a concentration from about 2 to about 20% by weight with respect to the weight of the resin,
    an agent dissolved or not in the resin, to increase the composition's reactivity with respect to illumination,
    a coupling agent in concentrations from about 0.1 to about 0.3% by weight with respect to the metallic powder,
    a wetting and/or dispersant agent in a concentration of less than about 1% by weight with respect to the metallic powder,
    a lubricant in a concentration of less than about 0.5% by weight with respect to the metallic powder,
    a carbon collector,
    an adhesive agent, and
    a metallic powder additive having a melting point lower than that of the metallic powder.

9. The composition according to claim 8 wherein the particles forming the metallic powder are coated with a coating which limits the absorption of light by the particles.

10. The composition according to claim 9, wherein the coating is comprised of a wax or a layer of oxidation formed by the oxidation of the particles forming the metallic powder.

11. The composition according to claim 10 wherein the metallic powder is a homogenous blend of metallic powders of at least two different particle sizes, having a particle size ratio of between about 1/10 and about 1/5.

12. The composition according to claim 10 wherein the metallic powder is a homogenous blend of metallic powders of at least two different particle sizes, having a particle size ratio of about 1/7.

13. The composition according to claim 11 wherein the photoinitiator is an α-amino-ketone.

14. The composition according to claim 13 wherein the photoinitiator is 2-benzyl-2-dimecthylamino-1-(4-morpholinophenyl)-butanone-1.

15. The composition according to claim 14 further comprising an activation agent selected from the group consisting of an isopropyl thioxanthone, 1-chloro-4-propoxythioxanthone, or 4-benzoyl-4'-methyldiphenyl sulfide and combinations thereof.

16. The composition according to claim 15 further comprising ethyl p-dimethylaminobenzoate as a co-initiator with the activation agent.

17. A process for obtaining metallic products from the paste composition according to claim 14;
    a) forming a composite part comprised of thin superimposed layers of paste by repeating the following steps:
        transforming a layer just formed by photopolymerization of the bonding agent, and
        coating of the transformed layer by a new non-transformed layer,
    b) eliminating the polymer contained in the composite part by a thermal treatment in a debinding step to form a metallic part; and
    c) sintering the debinded metallic part.

18. The process according to claim 17, wherein the layers of paste placed have a thickness of less than about 50 μm.

19. The process according to claim 18 wherein alternatively followed by an additional dosage treatment of carbon residues in the presence of oxygen, carbon monoxide or carbon dioxide.

20. The process according to claim 19 wherein the thermal cycle of the debinding stage includes rapid heating stages and slow heating stages and pauses in zones in which the bonding agent is rapidly degraded thereby comprising a complete cycle with a duration of less than 48 hours, the rapid heating stages further occurring in temperature zones in which the bonding agent degrades little or not at all.

21. The process according to claim 20 wherein the sintering stage induces the consolidation of the product by densification of the porous debinded product at a temperature lower than the melting point of the metal.

22. The process according to claim 21 wherein the sintering stage is performed under a neutral or reduction liquefied gas system or under vacuum, under conditions such that the homogeneity of the temperature is at most +/−10° C.

23. The process according to claim 22 wherein during the sintering stage the thermal cycle includes rapid heating stages in temperature zones with change greater than or equal to about 5° C./min in which the debinded product does not undergo transformation and slow heating stages or stabilization stages lasting less than 1 hour with change less than or equal to about 1° C./min in zones in which the debinded product undergoes physical transformations, and a sintering stage lasting between about 30 minutes and about 5 hours and more preferably about 1 hour.

24. The debinded and sintered metallic product obtained by the procedure according to claim 23.

25. The product according to claim 24 wherein the product presents less than about 2% by mass of carbon residue with respect to the mass of the resin in the initial composition.

26. The product according to claim 25 wherein the product has temporary support elements created in such a way that in a radius of 1.5 mm there are at least two distinct points pertaining to two distinct solidified support elements on a single layer in order to support the overhanging parts of the product.

* * * * *